United States Patent [19]

Suzuki et al.

[11] Patent Number: 4,811,352
[45] Date of Patent: Mar. 7, 1989

[54] SEMICONDUCTOR INTEGRATED LIGHT EMITTING DEVICE

[75] Inventors: Masatoshi Suzuki; Shigeyuki Akiba, both of Tokyo; Hideaki Tanaka, Hoya; Yukitoshi Kushiro, Tokyo, all of Japan

[73] Assignee: Denshin Denwa Kabushiki Kaisha Kokusai, Tokyo, Japan

[21] Appl. No.: 147,229

[22] Filed: Jan. 22, 1988

[30] Foreign Application Priority Data

Jan. 29, 1987 [JP] Japan .................................. 62-17252

[51] Int. Cl.$^4$ .......................... H01S 3/19; H01L 33/00
[52] U.S. Cl. ........................................ 372/45; 357/17; 372/50; 372/96
[58] Field of Search ...................... 357/17, 19; 372/50, 372/96, 45; 350/96.11, 96.12, 96.3

[56] References Cited

U.S. PATENT DOCUMENTS

| | | | |
|---|---|---|---|
| 4,622,674 | 11/1986 | Mito ....................................... | 372/50 |
| 4,656,636 | 4/1987 | Amann et al. ......................... | 372/50 |
| 4,720,468 | 1/1988 | Menigaux et al. ..................... | 372/50 |
| 4,720,835 | 1/1988 | Akiba et al. ........................... | 372/50 |

*Primary Examiner*—William L. Sikes
*Assistant Examiner*—Georgia Y. Epps
*Attorney, Agent, or Firm*—Emmanuel J. Lobato; Robert E. Burns

[57] ABSTRACT

A semiconductor integrated light emitting device is disclosed which comprises a light emitting waveguide including a light emitting layer, and an external waveguide directly coupled to the light emitting waveguide. In accordance with the present invention, the light emitting waveguide and the external waveguide are mutually laminated in the vicinity of a region where they are directly coupled together.

The intensity of the optical output from the light emitting waveguide is modulated in the external waveguide by the electroabsorption effect.

3 Claims, 5 Drawing Sheets

SEMICONDUCTOR INTEGRATED LIGHT EMITTING DEVICE

BACKGROUND OF THE INVENTION

The present invention relates to a semiconductor integrated light emitting device in which a light emitting device and an external waveguide are integrated on the same semiconductor substrate and, more particularly, to a structure for coupling a light emitting waveguide of the light emitting device with an external waveguide.

Semiconductor lasers and similar semiconductor light emitting devices have such features as small size, high efficiency and high reliability, and are now widely used in the fields of optical fiber communication and optical information processing; in particular, they are at the core of technology in the field of optoelectronics. On the other hand, enlargement and sophistication of the optoelectronics technology are now in progress, and it is essential to develop semiconductor integrated light emitting devices of the types wherein an external waveguide for modulation use is integrated with the light emitting device, wherein a grating external waveguide is integrated with the light emitting device to constitute a distributed Bragg reflector (hereinafter referred to simply as "DBR") laser, and wherein a modulating feature is additionally provided on an extension of the grating external waveguide.

In the integration of the light emitting device and the external waveguide on the same substrate, what is important technically and in terms of manufacture as well is how to implement the optical coupling between the light emitting waveguide of the light emitting device and the external waveguide.

Of methods proposed so far for optically coupling the both waveguides with each other, a direct coupling method which directly connects them at one end thereof is considered as the most promising because of high coupling efficiency and low allowable limits of manufacturing errors, and actually this method is now under study for practical applications.

However, devices of good operational performance and ready for manufacturing have not yet been proposed by the prior art.

SUMMARY OF THE INVENTION

An object of the present invention is to provide a semiconductor integrated light emitting device which obviates the above-mentioned defects of the prior art and permits more efficient application of light from the light emitting waveguide including the light emitting layer to the external waveguide.

The characteristic feature of the present invention resides in that the light emitting waveguide including the light emitting layer and the external waveguide are mutually laminated in the vicinity of the region where they are directly coupled to each other. The two waveguides are directly coupled by a butt-joint but either one of the two waveguides has an end portion overlying the other and is laminated to the other waveguide at a region where they abut.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention clear, an example of prior art will first be described.

Figure 1:
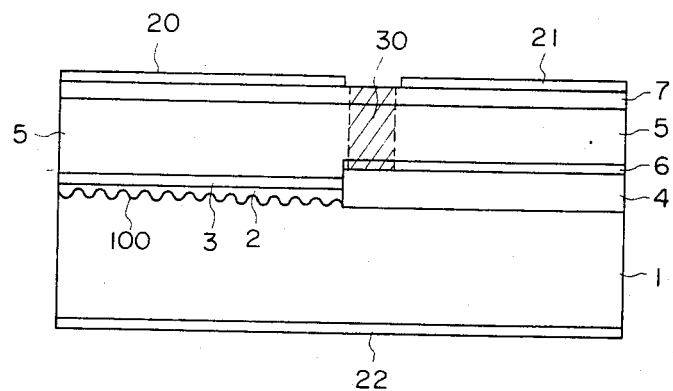
FIG. 1 is a schematic cross-section view of a prior art example.

FIG. 1 shows a prior art example which comprises a light emitting device which has a light emitting waveguide of a periodically irregular structure(corrugation)and acts as a distributed feedback (hereinafter referred to simply as "DFB") laser and a modulating element which has an external waveguide for modulating the laser output by the electroabsorption effect. An n-type InGaAsP waveguide layer 2 (whose composition provides a light emitting wavelength of about 1.3 μm) and an InGaAsP light emitting layer 3 (whose composition provides a light emitting wavelength of about 1.55 μm), which are combined into the light emitting waveguide, are laminated on an n$^+$-type InP substrate 1, and a p-type InP layer 5 and a p-type InGaAsP cap layer 7 are further laminated on the layer 3. A grating (or diffraction grating) 100 formed by corrugation is constituted at the interface between the n$^+$-type InP substrate 1 and the n-type InGaAsP waveguide layer 2. By injecting a current into the light emitting layer 3 the light emitting device oscillates at a single wavelength in the vicinity of the Bragg wavelength which is determined by the period of the corrugation and the value of refractive index. The laser output is guided to an n$^-$-type InGaAsP waveguide layer 4 (of a composition providing a light emitting wavelength of about 1.47 μm) which is connected to the light emitting waveguide and serves as the external waveguide for modulation use. The external waveguide layer 4 is covered with an n$^-$-type InP layer 6, the p-type InP layer 5 and the p-type InGaAsP cap layer 7. A current is injected into the light emitting layer 3 across electrodes 20 and 22, and an electric field is applied to the external waveguide layer 4 across electrodes 21 and 22. The light emitting device section and the modulating element section are electrically isolated from each other by a proton bombarded high resistance region 30. With such an arrangement, an excellent integrated light emitting device can be obtained which performs a stable single wavelength oscillation in response to the application of a constant current to the light emitting layer 3 across the electrodes 20 and 22 and produces an optical output of a very small spectral line width, even in the case of high-speed modulation, by intensity modulation of the output from the light emitting layer 3 through utilization of the electroabsorption effect of the external waveguide 4 which is produced by the application thereto of the electric field across the electrodes 21 and 22.

In FIG. 1, the light emitting waveguide layer, which is formed by the light emitting layer 3 and the n-type InGaAsP waveguide layer 2, and the n$^-$-type InGaAsP waveguide layer 4, which serves as the external waveguide, are directly coupled to each other; however, such a simple structure in which the both waveguides are merely joined at one end thereof poses a problem in terms of manufacture.

Figure 2A:
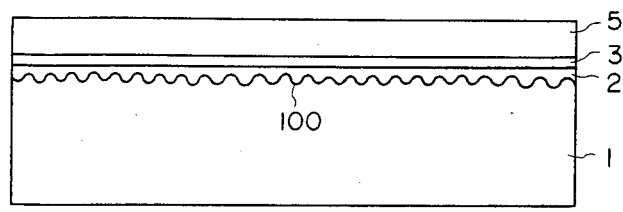
FIGS. 2A to 2D are cross-sectional views showing a sequence of steps involved in the manufacture of the prior art example.
Figure 2B:
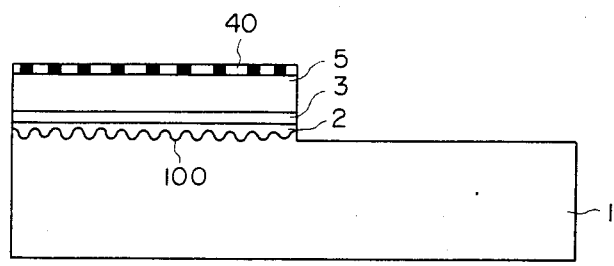
Figure 2C:
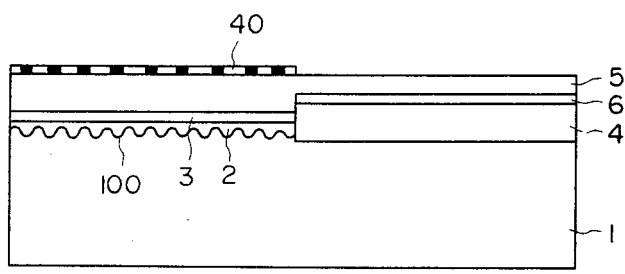
Figure 2D:
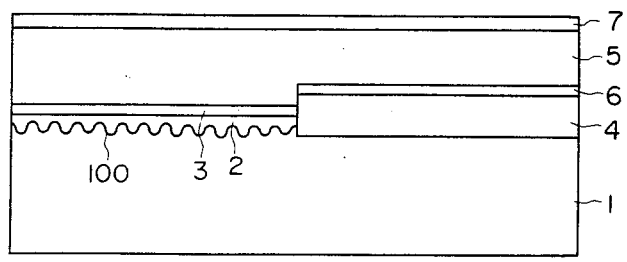

FIGS. 2A through 2D show a sequence of steps involved in the manufacture of the conventional integrated light emitting device. The manufacture starts with the formation of the n-type InGaAsP waveguide layer 2, the InGaAsP light emitting layer 3 and the p-type InP layer 5 on the n$^+$-type InP substrate 1 through the vapor phase epitaxy process, as shown in FIG. 2A. Next, the thus formed layers in the portion where the external waveguide is to be provided are etched away using a SiN film 40 as a mask, as depicted in FIG. 2B. Then the n$^-$-type InGaAsP waveguide layer 4, the n-type InP layer 6 and the p-type InP layer 5 are grown on the substrate 1, using the SiN film 40 as a selective growth mask, as shown in FIG. 2C. After removal of the SiN film 40 the p-type InP layer 5 and the p-InGaAsP cap layer 7 are grown all over the top surface of the substrate assembly, as depicted in FIG. 2D. In this way, the structure is obtained in which the light emitting waveguide (2, 3) and the external waveguide 4 are directly coupled to each other. In this instance, however, since many defects are introduced into the p-type InP layer 5 during the formation of the SiN film 40 in the step of FIG. 2B, the light emitting efficiency of the light emitting layer 3 is seriously impaired. Moreover, when the epitaxial growth is done using the SiN film 40 as the etching mask in the step of FIG. 2C, an abnormal growth occurs in the coupling portion, and at the same time impurities and defects are introduced from the SiN film 40 into the epitaxial growth layers 4, 6 and 5, markedly deteriorating their crystal quality. As a result, the oscillation threshold value in the DFB laser operation increases while the modulation by the external waveguide utilizing the electroabsorption effect also becomes difficult.

As mentioned above, in the conventional semiconductor integrated light emitting device the light emitting efficiency of the light emitting layer 3 is considerably low and the crystal quality of the external waveguide layer 4 is poor. In practice, this light emitting device does not emit light, or if it emits light, the oscillation threshold current is as high as around 700 mA, and it does not function as the light emitting device essentially. Furthermore, it is difficult, with the present manufacturing techniques, to completely couple the light emitting waveguide with the external waveguide without any gap therebetween, and consequently this leads to the essential drawback that the coupling efficiency of the both waveguides is low.

With reference to the accompanying drawings the present invention will hereinafter be described in detail.

Embodiment 1

Figure 3:
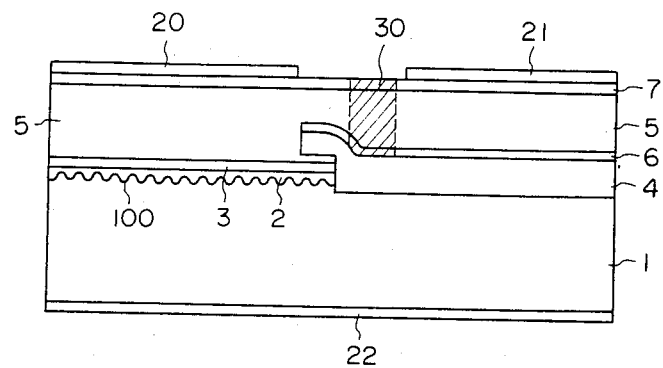
FIG. 3 is a schematic cross-section of a first embodiment of the present invention.

FIG. 3 is a schematic cross-sectional view of a first embodiment of the present invention. In the following description the parts corresponding to those in FIG. 1 showing the prior art example are identified by the same reference numerals and no description will be repeated thereon. As is evident from FIG. 3, the present invention differs from the prior art example in that the external waveguide 4 is laminated on the light emitting waveguide near a region where they are coupled together. With such a structure of the coupling portion, it is possible to eliminate the incomplete coupling between the both waveguides which is inevitable in the manufacture of the conventional light emitting device, and hence to provide a semiconductor integrated light emitting device of high coupling efficiency.

Figure 4A:
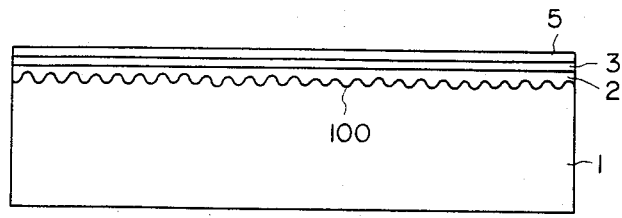
FIGS. 4A to 4E are cross-sectional views illustrating a sequence of steps involved in the manufacture of the embodiment depicted in FIG. 3.
Figure 4B:
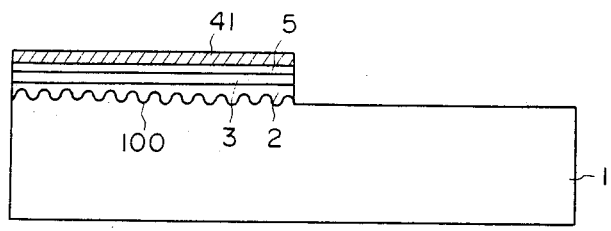
Figure 4C:
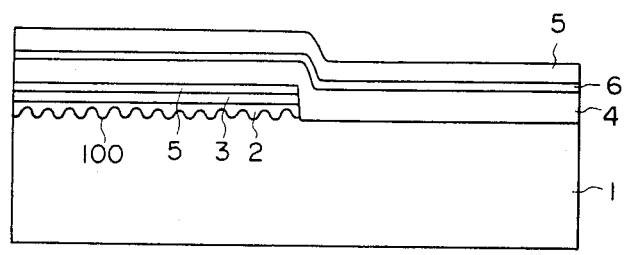
Figure 4D:
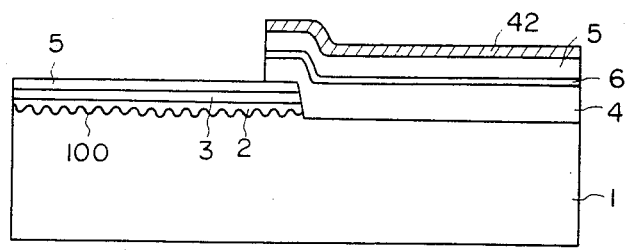
Figure 4E:
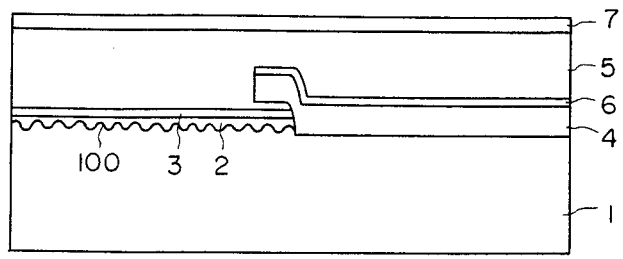

FIGS. 4A to 4E show, by way of example, a sequence of steps involved in the manufacture of the semiconductor integrated light emitting device structure of the present invention. This manufacturing process differs materialy from that of the conventional structure shown in FIG. 2 in that no mask for selective growth, such as the SiN film 40. That is to say, the waveguide layer 2, the light emitting layer 3 and the p-type InP layer 5 are formed by crystal growth on the substrate 1 as shown in FIG. 4 A, after which a region where the external waveguide is to be formed is etched away using a photoresist film 41 in place of the SiN film 40, as depicted in FIG. 4B, and then the external waveguide and other layers are grown all over the top surface, as shown in FIG. 4C. Thereafter the layers grown over the light emitting waveguide are etched away using a photoresist film 42, as shown in FIG. 4D. In this case, the both waveguides will be disconnected from each other unless the external waveguide is left unremoved on the light emitting waveguide near their coupling regions. The both waveguides need only to be laminated over a length of several millimicrons at the most, but even if they are formed overlapping 10 μm or so, there are substantially no influence on the device characteristics. The structure shown in FIG. 3 can be obtained by further growing the p-type InP layer 5 and the p-InGaAsP cap layer 7 all over the top surface, as depicted in FIG. 4E.

In present inventors' experiments in which the integrated light emitting device such as shown in FIG. 3 was operated, the oscillation threshold current of the DFB laser was as small as 20 to 30 mA. At the same time, a pn reverse breakdown voltage between the n-type InP layer 6 and the p-type InP layer 5 in the external waveguide region was approximately 40 volts and an excellent modulation characteristic based on the electroabsorption effect could be obtained.

Embodiment 2

Figure 5:
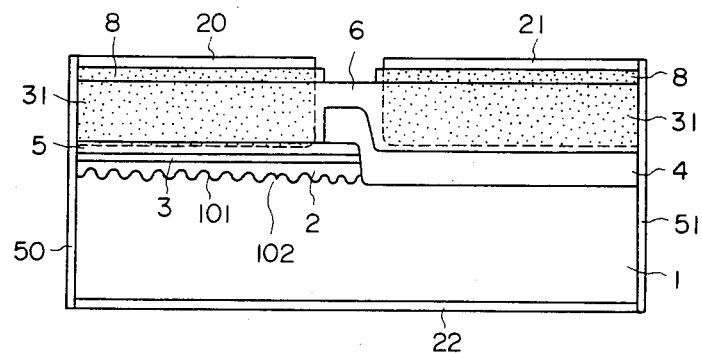
FIGS. 5 and 6 are schematic cross-sectional vies of second and third embodiments of the present invention.

FIG. 5 illustrates a second embodiment of the present invention, in which instead of forming the proton bombarded high resistance region 30 in FIG. 3, zinc diffused regions 31 are formed in the DFB laser section and the modulating section, respectively, and are electrically isolated from each other. In order to enhance the single wavelength property of the DFB laser, a λ/4 shift portion 102 is provided in a grating 101, and antireflection coating films 50 and 51 are formed on both end faces of the device. Incidentally, the λ/4 shift portion 102 is disposed further to the side of the modulating section than the center of the grating 101 so that the optical output to the modulating section may increase. Moreover, the cap layer 8 is formed of n-type InGaAsP.

Embodiment 3

Figure 6:
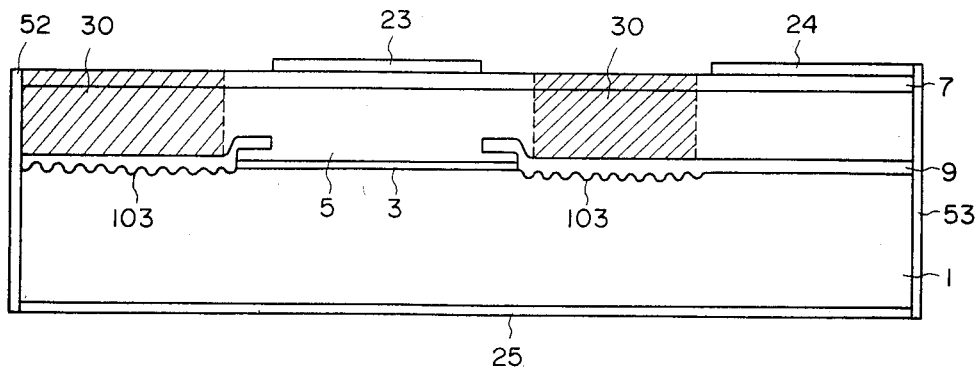

FIG. 6 illustrates a third embodiment of the present invention, in which the external waveguide is a grating waveguide. The light emitting waveguide is formed by the InGaAsP light emitting layer 3 alone, to the opposite ends of which are directly coupled with n$^-$-type InGaAsP waveguide layers 9 (corresponding to the composition providing the light emitting wavelength of about 1.3 μm) which are external waveguides. According to the present invention, the external waveguides 9 are laminated on the light emitting layer 3 in the neighborhood of their coupling regions, providing excellent coupling therebetween. Gratings 103 are formed at both ends of the light emitting waveguide. By injecting a current into the light emitting layer 3 across 23 and 25, the light emitting device oscillates at a single wavelength as the DBR laser, and by applying an electric field across electrodes 24 and 25 to that portion of the external waveguides in which no grating is provided, the phase modulation of the laser output light can be performed. Reference numerals 52 and 53 identify anti-reflection coating films.

An external modulation element which provides a narrow modulated spectral line width of light can be obtained by selecting the semiconductor material of the external waveguide layer 4 so that its energy gap Eg may be 30 to 40 meV larger than the energy hυ of the oscillation wavelength of the laser, in accordance with an invention entitled "Semiconductor Integrated Optical Modulating Element", filed by the present inventors on the even priority date with this application in Japan.

While in the above the present invention has been described in connection with the case of using materials of the InGaAsP/InP systems, the invention is also applicable to the cases of using materials of the AlGaAs/GaAs systems and AlInGaAs/InP systems and other materials. Besides, it is also possible to employ a multiple quantum well formed of such materials, in which case the energy gap mentioned in the above becomes the effective energy gap which is determined by the quantum well level. Although no reference has been made to a stripe structure for stabilizing the lateral mode, conventional structures such as a buried stripe structure, a ridge stripe structure and so forth can all be employed.

As described above, according to the present invention, the light emitting waveguide including the light emitting layer and the external waveguide are laminated in the vicinity of a region where they are directly coupled together. This structure permits substantial increase of the coupling efficiency of the both waveguides and provides a semiconductor integrated light emitting device in which a DFB laser and an electroabsorption modulating element, or the DFB laser and a modulating element are integrated on the same substrate. Furthermore, the waveguide structure proposed by the present invention is free from abnormal growth of the layers 4, 5 and 6 (abnormal swelling of the layers 4, 5 and 6 near the waveguide coupling region) which occurs buring the epitaxial growth shown in FIG. 2C in the manufacture of the conventional device. With the present etching technology, an etched end face does not become flat, and when the waveguide coupling portion is etched, the external waveguide 4 is also etched to form a gap between it and the light emitting waveguide, resulting in a substantial reduction of the coupling efficiency. However, the structure of the present invention is free from this problem as well. Accordingly, the structure of the present invention allows much ease in its manufacture.

The high performance light emitting device of the present invention is utilized in sophisticated fields of optoelectronics such as ultra high-speed optical fiber communication, coherent optical fiber communication, wevelength multiple optical fiber communication, and optical information processing. Accordingly, the present invention is of great utility in practical use.

What we claim is:

1. A semiconductor integrated light emitting device which comprises a substrate, a light emitting waveguide including a light emitting layer laminated on the substrate, an external waveguide laminated on the substrate directly coupled to the light emitting waveguide and electrodes provided to inject a current to the light emitting layer and to separately apply an electric field to the external waveguide thereby to modulate the intensity of the optical output from the light emitting waveguide by electroabsorption effect, characterized in that the light emitting waveguide and the external waveguide are mutually placed abutting each other and one has an end portion laminated upon the other at a region where they directly abutt and are coupled together.

2. A semiconductor integrated light emitting device according to claim 1, in which the light emitting waveguide comprises a grating having a λ/4 shift portion therein.

3. A semiconductor integrated light emitting device according to claim 1, in which the external waveguide comprises a grating.

* * * * *

UNITED STATES PATENT AND TRADEMARK OFFICE
CERTIFICATE OF CORRECTION

PATENT NO. : 4,811,352
DATED : Mar, 7, 1989
INVENTOR(S) : Suzuki et al

It is certified that error appears in the above-identified patent and that said Letters Patent is hereby corrected as shown below:

In the heading of the issued patent, correct the name of the assignee to read:

-- [73] Assignee: Kokusai Denshin Denwa Kabushiki Kaisha, Tokyo, Japan. --

Signed and Sealed this

Fifteenth Day of August, 1989

Attest:

DONALD J. QUIGG

*Attesting Officer*     *Commissioner of Patents and Trademarks*